US009279861B2

(12) United States Patent
Seo et al.

(10) Patent No.: US 9,279,861 B2
(45) Date of Patent: Mar. 8, 2016

(54) APPARATUS FOR TESTING SWITCHING OF POWER SEMICONDUCTOR MODULE

(71) Applicant: SAMSUNG ELECTRO-MECHANICS CO., LTD., Suwon (KR)

(72) Inventors: Shang Hoon Seo, Suwon (KR); Seung Hwan Kim, Suwon (KR); Suk Jin Ham, Suwon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 270 days.

(21) Appl. No.: 13/845,042

(22) Filed: Mar. 17, 2013

(65) Prior Publication Data

US 2014/0176180 A1 Jun. 26, 2014

(30) Foreign Application Priority Data

Dec. 26, 2012 (KR) .................. 10-2012-0153672

(51) Int. Cl.
*G01R 31/26* (2014.01)
*G01R 31/42* (2006.01)

(52) U.S. Cl.
CPC ..................... *G01R 31/42* (2013.01)

(58) Field of Classification Search
CPC .... G01R 31/2607; G01R 31/26; G01R 31/42; G01R 31/40; H02J 1/10; H02M 7/48
USPC .......... 324/765.01, 73.1, 432, 512, 246, 765, 324/762.01, 764.01; 323/272, 283
See application file for complete search history.

(56) References Cited

U.S. PATENT DOCUMENTS

| 7,688,101 B2 * | 3/2010 | Yim ........................ 324/762.06 |
| 2004/0034508 A1 * | 2/2004 | Cheng et al. .................. 702/185 |
| 2012/0081139 A1 * | 4/2012 | Yoshida .................... 324/750.16 |

FOREIGN PATENT DOCUMENTS

KR 10-0227267 11/1999

* cited by examiner

*Primary Examiner* — Son Le
(74) *Attorney, Agent, or Firm* — Ladas & Parry, LLP

(57) ABSTRACT

Disclosed herein is an apparatus for testing switching of a power semiconductor module, including: a power semiconductor module including a plurality of power semiconductor devices corresponding to a plurality of phases to test a switching operation of a corresponding power semiconductor device; a power supply unit supplying power to the power semiconductor module; a relay switching unit including a plurality of relay switch devices that connects or disconnects between the power semiconductor module and the power supply unit according to a relay control signal; and a control unit controlling the relay switching unit to test on/off characteristics of at least one of the plurality of power semiconductor devices individually or simultaneously, By this configuration, the on/off operations of the plurality of power semiconductor devices are tested individually or simultaneously by the control of the plurality of relay switch devices, thereby improving the user convenience and reducing the test time.

19 Claims, 3 Drawing Sheets

APPARATUS FOR TESTING SWITCHING OF POWER SEMICONDUCTOR MODULE

CROSS REFERENCE TO RELATED APPLICATION

This application claims the benefit of Korean Patent Application No. 10-2012-0153672, filed on Dec. 26, 2012, entitled "Apparatus For Testing Switching Of Power Semiconductor Module" which is hereby incorporated by reference in its entirety into this application.

BACKGROUND OF THE INVENTION

1. Technical Field

The present invention relates to an apparatus for testing switching of a power semiconductor module.

2. Description of the Related Art

Recently, a failure of a switch device has become a core issue in a power semiconductor, in particular, a power semiconductor module, such as an insulated gate bipolar mode transistor (IGBT), an intelligent power module (IPM), and the like.

A switch device for the power semiconductor module is heated and cooled due to a repetitive on/off operation, and thus a thermal stress due to a mismatch of coefficients of thermal expansion (CTEs) occurs, such that failures, such as peeling, cracking, etc., occur in the products.

An example of variables for determining durability of the power semiconductor module may include a bonding wire material, a bonding process, a die material, a substrate material, a solder kind, a solder shape, a base plate material, and the like, all of which have a close relationship with thermal resistance, such that it is difficult to select a material selection and establish a process.

Reliability of the power semiconductor module under the high-temperature or low-temperature operation becomes relatively stable with a development of a manufacturing technology. In particular, main operation characteristics in the fields of home appliances, electric car, and the like, having the use range expanded repeatedly perform the on/off operation, and thus power consumption is increased and a size of individual components is large. As a result, a change in temperature has been more focused as important factors, as compared with the existing low power semiconductor module.

Patent Document disclosed in the following Citation List discloses an apparatus for testing switching of a single, high-speed power semiconductor device as an apparatus for testing switching of a high-speed power semiconductor device.

The existing apparatus for testing switching of a power semiconductor module can test only the single switch device. Therefore, when a plurality of switch devices for a power semiconductor module is used, it may take a lot of time to test each of the switch devices.

Therefore, a new test apparatus capable of testing a plurality of switch devices for a power semiconductor module with a simple configuration of circuit is required.

PRIOR ART DOCUMENT

Patent Document (Patent Document 1) Korean Patent No. 10-0227267

SUMMARY OF THE INVENTION

The present invention has been made in an effort to provide an apparatus for testing switching of a power semiconductor module capable of individually testing a plurality of switch devices for a power semiconductor module as well as simultaneously various combinations of a plurality of switch devices for a power semiconductor module, by a control of a relay switch device.

According to a preferred embodiment of the present invention, there is provided an apparatus for testing switching of a power semiconductor module, including: a power semiconductor module including a plurality of power semiconductor devices corresponding to a plurality of phases to test a switching operation of a corresponding power semiconductor device; a power supply unit supplying power to the power semiconductor module; a relay switching unit including a plurality of relay switch devices that connects or disconnects between the power semiconductor module and the power supply unit according to a relay control signal; and a control unit controlling the relay switching unit to test on/off characteristics of at least one of the plurality of power semiconductor devices individually or simultaneously.

The power semiconductor module may include: a plurality of power semiconductor circuits corresponding to each phase and connected with the power supply unit in parallel, respectively, so as to supply or block power according to the relay control signal; and a gate driving power supply controlling a gate signal input according to a gate control signal so as to perform on/off operations of the plurality of power semiconductor circuits.

The plurality of power semiconductor circuits may include: a first power semiconductor circuit including a first phase upper power semiconductor device corresponding to a first phase and having a collector connected with an upper terminal of the power supply unit and an emitter connected with a lower terminal of the power supply unit and a first phase lower power semiconductor device having a collector connected with the emitter of the first phase upper power semiconductor device and an emitter connected with the lower terminal of the power supply unit; a second power semiconductor circuit including a second phase upper power semiconductor device corresponding to a second phase and having a collector connected with an upper terminal of the power supply unit and an emitter connected with a lower terminal of the power supply unit and a second phase lower power semiconductor device having a collector connected with the emitter of the second phase upper power semiconductor device and an emitter connected with the lower terminal of the power supply unit; and a third power semiconductor circuit including a third phase upper power semiconductor device corresponding to a third phase and having a collector connected with an upper terminal of the power supply unit and an emitter connected with a lower terminal of the power supply unit and a third phase lower power semiconductor device having a collector connected with the emitter of the third phase upper power semiconductor device and an emitter connected with the lower terminal of the power supply unit.

The first power semiconductor circuit may further include: a first phase upper diode having an anode connected with the emitter of the first phase upper power semiconductor device and a cathode connected with the collector of the first phase upper power semiconductor device and feed-backing collector-emitter current of the first phase upper power semiconductor device when the first phase upper power semiconductor device is turned off; and a first phase lower diode having an anode connected with the emitter of the first phase lower power semiconductor device and a cathode connected with the collector of the first phase lower power semiconductor device and feed-backing collector-emitter current of the first phase lower power semiconductor device when the first phase lower power semiconductor device is turned off.

The second power semiconductor circuit may further include: a second phase upper diode having an anode connected with the emitter of the second phase upper power semiconductor device and a cathode connected with the collector of the second phase upper power semiconductor device and feed-backing collector-emitter current of the second phase upper power semiconductor device when the second phase upper power semiconductor device is turned off; and a second phase lower diode having an anode connected with the emitter of the second phase lower power semiconductor device and a cathode connected with the collector of the second phase lower power semiconductor device and feed-backing collector-emitter current of the second phase lower power semiconductor device when the second phase lower power semiconductor device is turned off.

The third power semiconductor circuit may further include: a third phase upper diode having an anode connected with the emitter of the third phase upper power semiconductor device and a cathode connected with the collector of the third phase upper power semiconductor device and feed-backing collector-emitter current of the third phase upper power semiconductor device when the third phase upper power semiconductor device is turned off; and a third phase lower diode having an anode connected with the emitter of the third phase lower power semiconductor device and a cathode connected with the collector of the third phase lower power semiconductor device and feed-backing collector-emitter current of the third phase lower power semiconductor device when the third phase lower power semiconductor device is turned off.

The relay switching unit may include: a first phase relay switch circuit connecting or disconnecting the first power semiconductor circuit with or from the power supply unit so as to supply power to the first power semiconductor circuit; a second phase relay switch circuit connecting or disconnecting the second power semiconductor circuit with or from the power supply unit so as to supply power to the second power semiconductor circuit; and a third phase relay switch circuit connecting or disconnecting the third power semiconductor circuit with or from the power supply unit so as to supply power to the third power semiconductor circuit.

The first phase relay switch circuit may include: a first phase first relay switch device connected between the emitter and the collector of the first phase upper power semiconductor device in parallel; a first phase second relay switch device connected between the emitter of the first phase upper power semiconductor device and the lower terminal of the power supply unit in series; and a first phase third relay switch device connected between the emitter of the first phase lower power semiconductor device and the lower terminal of the power supply unit in series.

The second phase relay switch circuit may include: a second phase first relay switch device connected between the emitter and the collector of the second phase upper power semiconductor device in parallel; a second phase second relay switch device connected between the emitter of the second phase upper power semiconductor device and the lower terminal of the power supply unit in series; and a second phase third relay switch device connected between the emitter of the second phase lower power semiconductor device and the lower terminal of the power supply unit in series.

The third phase relay switch circuit may include: a third phase first relay switch device connected between the emitter and the collector of the third phase upper power semiconductor device in parallel; a third phase second relay switch device connected between the emitter of the third phase upper power semiconductor device and the lower terminal of the power supply unit in series; and a third phase third relay switch device connected between the emitter of the third phase lower power semiconductor device and the lower terminal of the power supply unit in series.

The control unit may control the relay switching unit to supply a first switching control signal controlling to switch on only the second relay switch device of the corresponding phase, respectively and to supply a second switching control signal controlling to switch off the first and third relay switch devices of the corresponding phase, when testing each of the on/off characteristics of the upper power semiconductor device of each phase among the plurality of upper and lower power semiconductor devices.

The control unit may control the relay switching unit to supply a first switching control signal controlling to switch on only the first and second relay switch device of the corresponding phase, respectively, and to supply a second switching control signal controlling to switch off the second switch device of the corresponding phase, when testing each of the on/off characteristics of the lower power semiconductor device of each phase among the plurality of upper and lower power semiconductor devices.

The control unit may control the relay switching unit to supply a first switching control signal controlling to switch on only the third relay switch device of the corresponding phase and to supply a second switching control signal controlling to switch off the first and second relay switch devices of the corresponding phase, when simultaneously testing the upper and lower power semiconductor devices of the same phase among the plurality of upper and lower power semiconductor devices.

The control unit may control the relay switching unit to supply a first switching control signal controlling to switch on only the second relay switch device of the corresponding phase simultaneously and to supply a second switching control signal controlling to switch off the first and third relay switch devices of the corresponding phase, when simultaneously testing the two upper power semiconductor devices of different phases among the plurality of upper and lower power semiconductor devices.

The control unit may control the relay switching unit to supply a first switching control signal controlling to switch on only the first and third relay switch device of the corresponding phase simultaneously and to supply a second switching control signal controlling to switch off the second relay switch device of the corresponding phase, when simultaneously testing the two lower power semiconductor devices of different phases among the plurality of upper and lower power semiconductor devices.

The control unit may control the relay switching unit to supply a first switching control signal controlling to switch on only the second relay switch device of a phase corresponding to the corresponding upper power semiconductor device and the first and third relay switch device of a phase corresponding to the corresponding lower power semiconductor device and to supply a second switching control signal controlling to switch off the first and third relay switch device of a phase corresponding to the corresponding upper power semiconductor device and the second relay switch device of a phase corresponding to the corresponding lower power semiconductor device, when simultaneously testing the upper power semiconductor device of any one phase and the lower power semiconductor device of a phase different from the upper power semiconductor device among the plurality of upper and lower power semiconductor devices.

The control unit may control the relay switching unit to supply a first switching control signal only controlling to switch on only the second relay device of each phase simultaneously and to supply a second switching control signal controlling to switch off the first and third relay switch devices of each phase, when simultaneously testing the three upper power semiconductor devices of each phase among the plurality of upper and lower power semiconductor devices.

The control unit may control the relay switching unit to supply a first switching control signal controlling to switch on only to the first and third relay switch device of each phase simultaneously and to supply a second switching control signal controlling to switch off the second relay switch device of each phase, when simultaneously testing the three lower power semiconductor devices of each phase among the plurality of upper and lower power semiconductor devices.

The control unit may control the relay switching unit to supply a first switching control signal controlling to switch on only to the third relay switch device of each phase simultaneously and to supply a second switching control signal controlling to switch off the first and second relay switch devices of each phase, when simultaneously testing six of the plurality of upper and lower power semiconductor devices.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
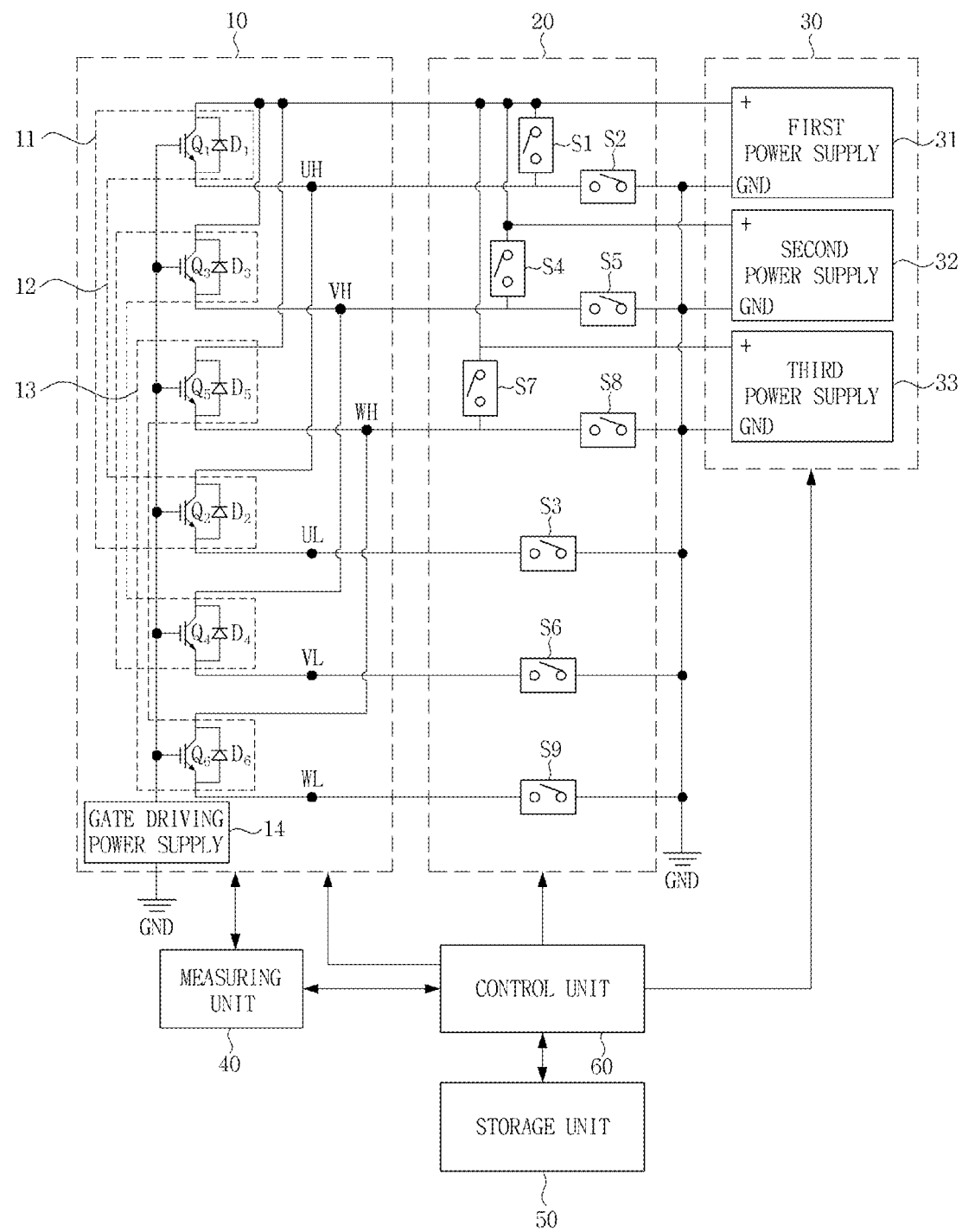
FIG. 1 is a circuit diagram of an apparatus for testing switching of a power semiconductor module according to a preferred embodiment of the present invention.
Figure 2:
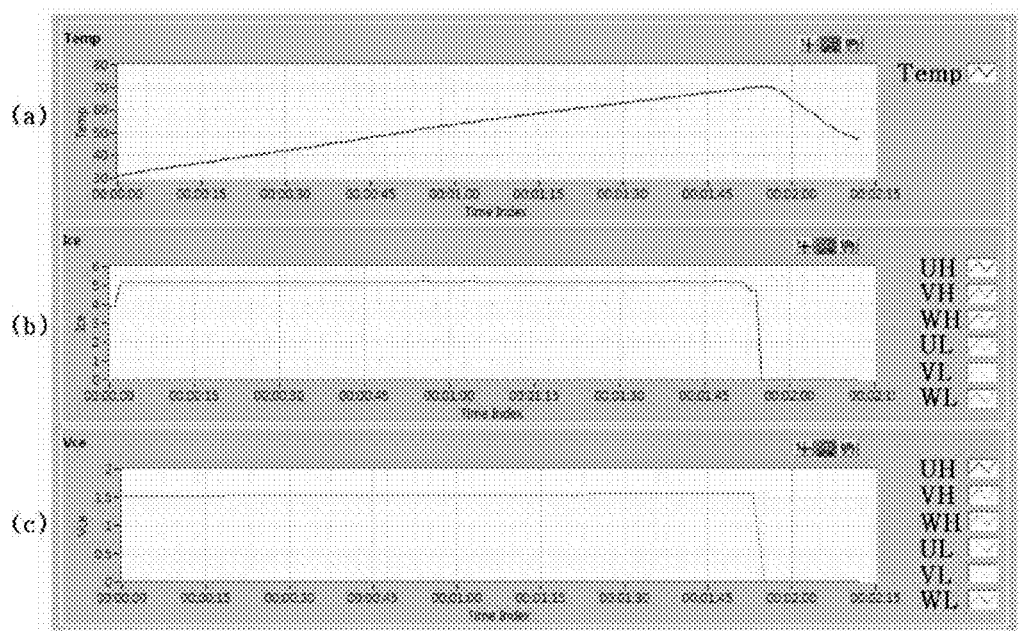
FIGS. 2A to 2C are graphs illustrating measurement results according to a switching test of a single power semiconductor device from the apparatus for testing switching of a power semiconductor module illustrated in FIG. 1.
Figure 3:
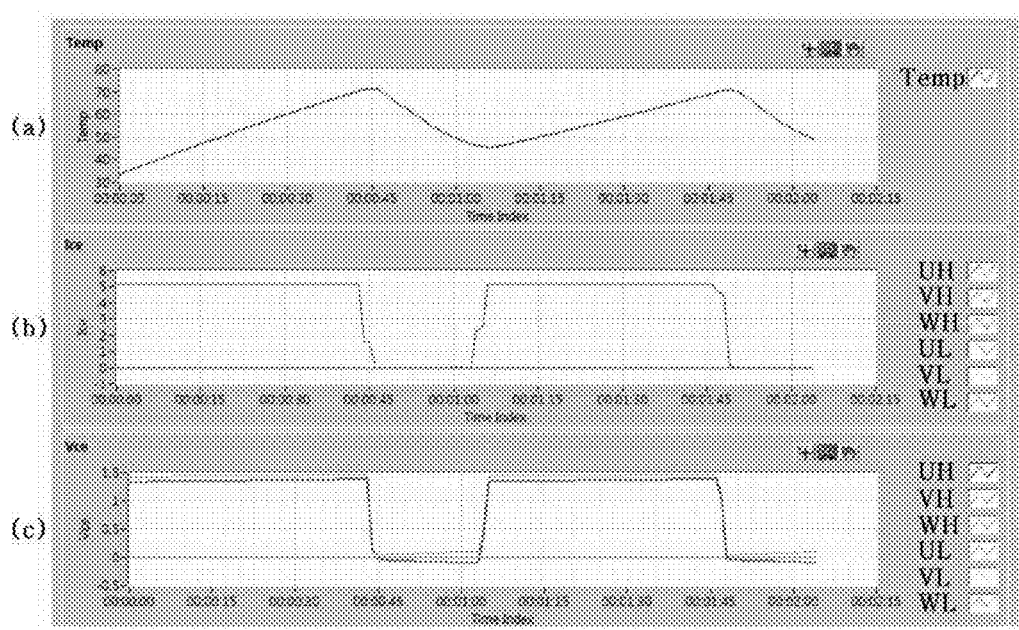
FIGS. 3A to 3C are graphs illustrating measurement results according to a simultaneous switching test of two power semiconductor devices from the apparatus for testing switching of a power semiconductor module illustrated in FIG. 1.
Figure 4:
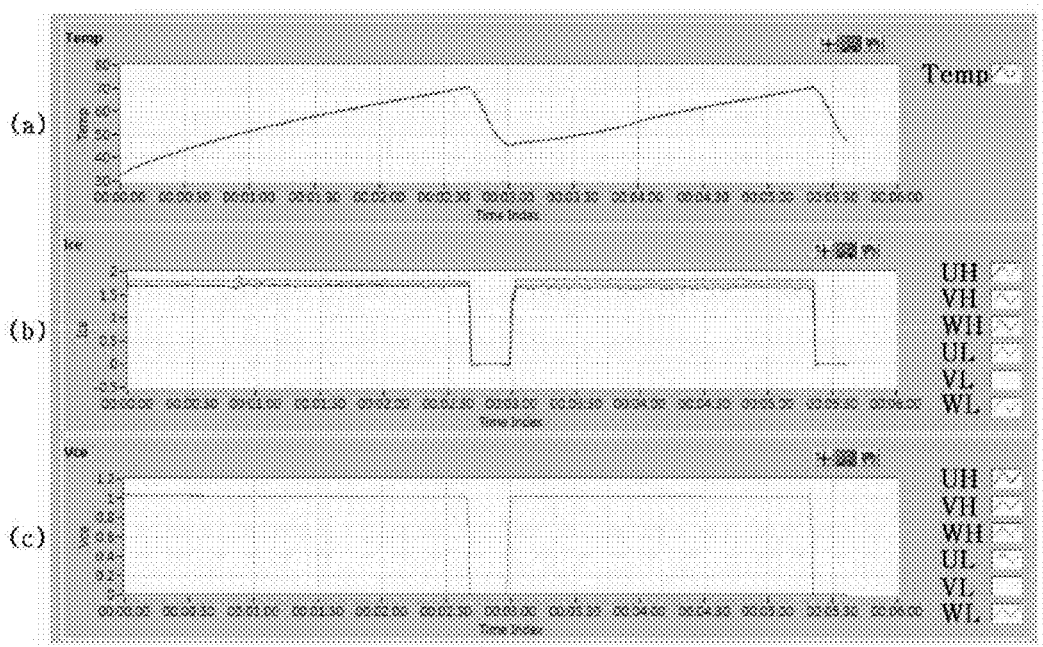
FIGS. 4A to 4C are graphs illustrating measurement results according to a simultaneous switching test of three power semiconductor devices from the apparatus for testing switching of a power semiconductor module illustrated in FIG. 1.
Figure 5:
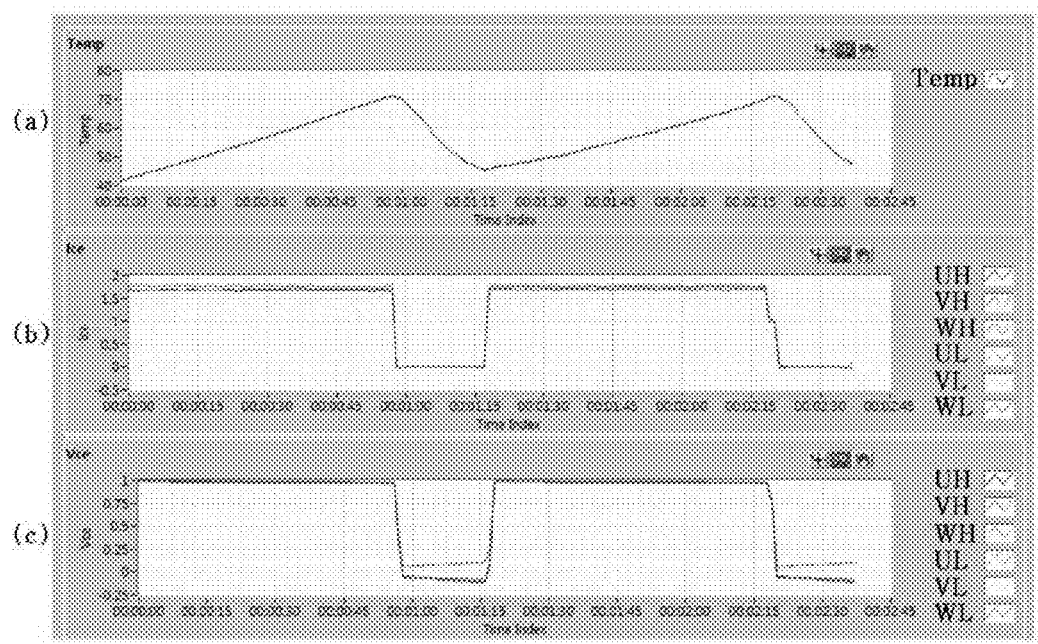
FIGS. 5A to 5C are graphs illustrating measurement results according to a simultaneous switching test of six power semiconductor devices from the apparatus for testing switching of a power semiconductor module illustrated in FIG. 1.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention are described in detail with reference to the accompanying drawings.

FIG. 1 is a circuit diagram of an apparatus for testing switching of a power semiconductor module according to a preferred embodiment of the present invention.

Referring to FIG. 1, an apparatus for testing switching of a power semiconductor module according to a preferred embodiment of the present invention is configured to include a power semiconductor module 10, a relay switching unit 20, a power supply unit 30, a measuring unit 40, a storage unit 50, and a control unit 60.

The power semiconductor module 10 is configured of at least one power semiconductor element and in the present invention, is configured of N power semiconductor circuits 11, 12, and 13 corresponding to N phases (for example, U, V, and W) for a driving of a predetermined apparatus (for example, motor) (not illustrated).

The N power semiconductor circuits 11, 12, and 13 are configured to include N pairs of power semiconductor devices configured of upper power semiconductor devices $Q_1$, $Q_3$, and $Q_5$ and lower semiconductor devices $Q_2$, $Q_4$ and $Q_8$ that are switched on/off according to gate control signals corresponding to the N phases designed in the predetermined apparatus.

In detail, the power semiconductor circuit (hereinafter, first power semiconductor circuit 11) of a first phase U is configured to include a first phase upper power semiconductor device $Q_1$ that has a collector connected with an upper terminal of the power supply unit 30 and an emitter connected with a lower terminal of the power supply unit 30, a first phase lower power semiconductor device $Q_2$ that has a collector connected with an emitter of the first phase upper power semiconductor device $Q_1$ and an emitter connected with the lower terminal of the power supply unit 30, a first phase upper diode $D_1$ that has an anode connected with the emitter of the first phase upper power semiconductor device $Q_1$ and a cathode connected with a collector of the first phase upper power semiconductor device $Q_1$ and feedbacks collector-emitter current (hereinafter, first phase upper current) of the first phase upper power semiconductor device $Q_1$ when the first phase upper power semiconductor device $Q_1$ is turned off, and a first phase lower diode $D_2$ that has an anode connected with an emitter of the first phase lower power semiconductor device $Q_2$ and a cathode connected with a collector of the first phase lower power semiconductor device $Q_2$ and feedbacks collector-emitter current (hereinafter, first phase lower current) of the first phase lower power semiconductor device $Q_2$ when the first phase lower power semiconductor device $Q_2$ is turned off.

In detail, the power semiconductor circuit (hereinafter, second power semiconductor circuit 12) of a second phase V is configured to include a first phase upper power semiconductor device $Q_3$ that has a collector connected with an upper terminal of the power supply unit 30 and an emitter connected with a lower terminal of the power supply unit 30, a first phase lower power semiconductor device $Q_4$ that has a collector connected with an emitter of the first phase upper power semiconductor device $Q_3$ and an emitter connected with the lower terminal of the power supply unit 30, a first phase upper diode D3 that has an anode connected with the emitter of the first phase upper power semiconductor device $Q_3$ and a cathode connected with a collector of the first phase upper power semiconductor device $Q_3$ and feedbacks collector-emitter current (hereinafter, first phase upper current) of the first phase upper power semiconductor device $Q_3$ when the first phase upper power semiconductor device $Q_3$ is turned off, and a first phase lower diode D4 that has an anode connected with an emitter of the first phase lower power semiconductor device $Q_4$ and a cathode connected with a collector of the first phase lower power semiconductor device $Q_4$ and feedbacks collector-emitter current (hereinafter, first phase lower current) of the first phase lower power semiconductor device $Q_4$ when the first phase lower power semiconductor device $Q_4$ is turned off.

In detail, the power semiconductor circuit (hereinafter, third power semiconductor circuit 13) of a third phase W is configured to include a first phase upper power semiconductor device $Q_5$ that has a collector connected with an upper terminal of the power supply unit 30 and an emitter connected with a lower terminal of the power supply unit 30, a first phase lower power semiconductor device $Q_6$ that has a collector connected with an emitter of the first phase upper power semiconductor device $Q_5$ and an emitter connected with the lower terminal of the power supply unit 30, a first phase upper diode D5 that has an anode connected with the emitter of the first phase upper power semiconductor device $Q_5$ and a cathode connected with a collector of the first phase upper power semiconductor device $Q_5$ and feedbacks collector-emitter current (hereinafter, first phase upper current) of the first phase upper power semiconductor device $Q_5$ when the first phase upper power semiconductor device $Q_5$ is turned off, and a first phase lower diode D6 that has an anode connected with an emitter of the first phase lower power semiconductor device $Q_6$ and a cathode connected with a collector of the first phase lower power semiconductor device $Q_6$ and feedbacks collector-emitter current (hereinafter, first phase lower current) of the first phase lower power semiconductor device $Q_6$ when the first phase lower power semiconductor device $Q_6$ is turned off.

Further, the power semiconductor module 10 may further include a gate driving power supply 14 applying a high signal H and a low signal to gates of the corresponding power semiconductor devices in order to control on/off operations of the N pairs of upper and lower power semiconductor devices.

The relay switching unit 20 is switched on/off according to the control signal input from the control unit 60 and in the present invention, a total of nine relay switch devices S1 to S9 by providing three relay switch devices for each phase are used.

The relay switching unit 20 is configured to include a plurality of first phase relay switches S1 to S3 connecting the first power semiconductor circuit 11 with the power supply unit 30 through to various paths to apply power to the first power semiconductor circuit 11, a plurality of second phase relay switches S4 to S6 connecting the second power semiconductor circuit 12 with the power supply unit 30 through various paths to apply power to the second power semiconductor circuit 12, and a plurality of third phase relay switches S7 to S9 connecting the third power semiconductor circuit 13 with the power supply 30 through various paths to apply power to the third power semiconductor circuit 13.

In detail, the plurality of first phase relay switches S1 to S3 are configured to include a first phase first relay switch device S1 connected between the emitter and the collector of the first phase upper power semiconductor device $Q_1$ in parallel, a first phase second relay switch device S2 connected between the emitter of the first phase upper power semiconductor device $Q_1$ and the lower terminal of the power supply unit 30 in series, and a first phase third relay switch device S3 connected between the emitter of the first phase lower power semiconductor device $Q_2$ and the lower terminal of the power supply unit 30 in series.

The plurality of second phase relay switches S4 to S6 are configured to include a second phase first relay switch device S4 connected between the emitter and the collector of the second phase upper power semiconductor device $Q_3$ in parallel, a second phase second relay switch device S5 connected between the emitter of the second phase upper power semiconductor device $Q_3$ and the lower terminal of the power supply unit 30 in series, and a second phase third relay switch device S6 connected between the emitter of the second phase lower power semiconductor device $Q_4$ and the lower terminal of the power supply unit 30 in series.

Further, the plurality of third phase relay switches S7 to S9 are configured to include a third phase first relay switch device S1 connected between the emitter and the collector of the third phase upper power semiconductor device $Q_5$ in parallel, a third phase second relay switch device S7 connected between the emitter of the third phase upper power semiconductor device $Q_5$ and the lower terminal of the power supply unit 30 in series, and a third phase third relay switch device S9 connected between the emitter of the third phase lower power semiconductor device $Q_6$ and the lower terminal of the power supply unit 30 in series.

The power supply unit 30 supplies voltage to the power semiconductor module 10 formed of N phases and is configured to include at least one power supplies 31, 32, and 33.

For example, when the power supply unit 30 supplies power to the three phase power semiconductor module 10, if a power supply is one, the first, second, and third power semiconductor circuits 11, 12, and 13 may be each connected with one power supply (for example, 31) in parallel, if a power supply is two, two power semiconductor circuits (for example, 11 and 12) of the first to third power semiconductor circuits 11, 12, and 13 may be connected with one power supply (for example 31) and the other power semiconductor circuit (for example, 13) may be connected with the other power supply (for example, 32), and if the power supply is three, the power semiconductor circuits 11, 12, and 13 may be each connected with three power supplies (for example, 31, 32, and 33) in parallel so as to correspond to one another.

When the power supply unit 30 uses a plurality of power supplies, a deterioration of the power supply occurring at the time of testing the on/off operation of the power semiconductor module 10 for a long period of time is reduced and a replacement into another power supply is easy at the time of the failure of a power supply, such that it is possible to prevent the test from stopping due to the failure of a power supply.

The measuring unit 40 measures the temperature, current, and voltage of the corresponding power semiconductor device according to the on/off of the relay switching unit 20 by the control of the control unit 60 to be described below in detail.

In this case, it is possible to test the on/off characteristics of the corresponding power semiconductor device by comparing the temperature, current, and voltage of the corresponding power semiconductor device measured by the measuring unit 40 with the temperature, current, and voltage of the corresponding power semiconductor device preset and stored in the storage unit 50.

That is, when the value measured by the measuring unit 40 is present within a tolerable value of the set value pre-stored in the storage unit 50, it may be determined that the on/off characteristics of the corresponding power semiconductor devices are good. To the contrary, when the value measured by the measuring unit 40 is out of the tolerable range of the set value, it may be determined that the on/off characteristics of the corresponding power semiconductor devices are poor. The results measured by the measuring unit 40 are illustrated in FIGS. 2 to 5 below.

The control unit 60 generally controls the switching test apparatus of the power semiconductor module 10, in particular, controls to test the on/off operation of at least one of the power semiconductor devices $Q_1$, $Q_2$, $Q_3$, $Q_4$, $Q_5$, and $Q_6$ individually or simultaneously.

The control unit 60 controls the on/off of the relay switching unit 20 connecting between the power semiconductor module 10 and the power supply unit 30 through various paths to supply power to the corresponding power semiconductor devices so as to test the on/off operation of the corresponding power semiconductor device.

For example, the control unit 60 may generate a first switching control signal turning on the corresponding relay switch device or a second switching control signal turning off the corresponding relay switch device and provide the generated control signals to the relay switching unit 20.

Further, the control unit 60 controls the gate driving power supply 14 to apply a 'high signal H' or a 'low signal L' to the gates of the corresponding power semiconductor devices so as for the corresponding power semiconductor device to perform the on/off operation.

The control unit 60 may test the six power semiconductor devices $Q_1$, $Q_2$, $Q_3$, $Q_4$, $Q_5$, and $Q_6$, respectively (one by one) or test two, three, or six, simultaneously.

Hereinafter, the switching test according to the number of power semiconductor devices used in the power semiconductor module according to the preferred embodiment of the present invention by the control of the control unit 60 will be described in more detail.

Test One Power Semiconductor Device

When testing only one power semiconductor device, the control unit 60 may control the relay switching unit 20 as follows.

For example, when testing the first phase upper power semiconductor device $Q_1$, the control unit 60 controls the relay switching unit 20 to supply the first switching control signal controlling to switch on only the first phase second relay switch device S2 and to supply a second switching control signal controlling to switch off only the remaining relay switch devices S1 and S3 to S9, such that the collector of the first phase upper power semiconductor device $Q_1$ is connected with the upper terminal of the power supply unit 30 and the emitter of the first phase upper power semiconductor device $Q_1$ is connected with the lower terminal of the power supply unit 30 so as to connect the power supply unit 30 with only the first phase upper power semiconductor device $Q_1$.

Similarly, when testing the first phase lower power semiconductor device $Q_2$, the control unit 60 controls the relay switching unit 20 to supply the first switching control signal controlling to switch on the first phase first relay switch device S1 and the first phase third relay switch device S3 and to supply a second switching control signal controlling to switch off the remaining relay switch devices S2 and S4 to S9, such that the collector of the first phase lower power semiconductor device $Q_2$ is connected with the upper terminal of the power supply unit 30 and the emitter of the first phase lower power semiconductor device $Q_2$ is connected with the lower terminal of the power supply unit 30 so as to connect the power supply unit 30 with only the first phase lower power semiconductor device $Q_2$.

By the above method, the control unit 60 controls the relay switching unit 20 to supply the first switching control signal and the second switching control signal to the corresponding relay switch devices so as to test the on/off operations of the second phase upper and lower power semiconductor devices $Q_3$ and $Q_4$ and the third phase upper and lower power semiconductor devices $Q_5$ and $Q_6$, respectively.

TABLE 1

| Division | Phase | S1 | S2 | S3 | S4 | S5 | S6 | S7 | S8 | S9 |
|---|---|---|---|---|---|---|---|---|---|---|
| $Q_1$ | UH | off | on | Off | off | off | off | off | off | off |
| $Q_2$ | VH | off | off | Off | off | on | off | off | off | off |
| $Q_3$ | WH | off | off | Off | off | off | off | off | on | off |
| $Q_4$ | UL | on | off | On | off | off | off | off | off | off |
| $Q_5$ | VL | off | off | Off | on | off | on | off | off | off |
| $Q_6$ | WL | off | off | Off | off | off | off | on | off | on |

Simultaneously Test Two Power Semiconductor Devices

When testing two power semiconductor devices simultaneously, the control unit 60 may control the relay switching unit 20 as follows.

The two power semiconductor devices may be tested simultaneously by the following two methods, a method (first method) of simultaneously testing the on/off operations of the pair of upper and lower power semiconductor devices connected with each other in series and having the same phase or a method (second method) of simultaneously testing the on/off operations of the two power semiconductor devices connected with each other in parallel and having different phases.

First, the first method simultaneously tests the pairs $Q_1$-$Q_2$, $Q_3$-$Q_4$, or $Q_5$-$Q_6$ of upper and lower power semiconductor devices connected with each other in series and having the same phase. For example, when testing the pair $Q_1$-$Q_2$ of first phase upper and lower power semiconductor devices simultaneously, the control unit 60 controls the relay switching unit 20 to supply the first switching control signal controlling to switch on only the first phase third relay switch device S3 and to supply a second switching control signal controlling to switch off only the remaining relay switch devices S1 and S2 and S4 to S9, such that the collector of the first phase upper power semiconductor device $Q_1$ is connected with the upper terminal of the power supply unit 30 and the emitter of the first phase lower power semiconductor device $Q_2$ is connected with the lower terminal of the power supply unit 30 so as to connect only the first power semiconductor circuit 11 with the power supply unit 30 in parallel.

Further, when testing the pair $Q_3$-$Q_4$ of second phase upper and lower power semiconductor devices simultaneously, the control unit 60 controls the relay switching unit 20 to supply the first switching control signal controlling to switch on only the second phase third relay switch device S6 and to supply a second switching control signal controlling to switch off only the remaining relay switch devices S1 to S5 and S7 to S9, such that the collector of the second phase upper power semiconductor device $Q_3$ is connected with the upper terminal of the power supply unit 30 and the emitter of the second phase lower power semiconductor device $Q_4$ is connected with the lower terminal of the power supply unit 30 so as to connect only the second power semiconductor device 12 with the power supply unit 30 in parallel.

Similarly, when testing the pair $Q_5$-$Q_6$ of third phase upper and lower power semiconductor devices simultaneously, the control unit 60 controls the relay switching unit 20 to supply the first switching control signal controlling to switch on only the third phase third relay switch device S9 and to supply a second switching control signal controlling to switch off only the remaining relay switch devices S1 to S8, such that the collector of the third phase upper power semiconductor device $Q_5$ is connected with the upper terminal of the power supply unit 30 and the emitter of the third phase lower power semiconductor device $Q_6$ is connected with the lower terminal of the power supply unit 30 so as to connect only the third power semiconductor device 13 with the power supply unit 30 in parallel.

Meanwhile, the second method simultaneously tests the two power semiconductor devices connected with each other in parallel and having different phases. For example, when testing the on/off operations of first phase upper power semiconductor device $Q_1$ and the second phase upper power semiconductor device $Q_3$ simultaneously, the control unit 60 controls the relay switching unit 20 to supply the first switching control signal controlling to switch on only the first phase second relay switch device S2 and the second phase second relay switch device S5 and to supply a second switching control signal controlling to switch off the remaining relay switch devices S1, S3 and S4, and S6 to S9, such that the collectors of each of the first phase upper power semiconductor device $Q_1$ and the second phase upper power semiconductor device $Q_3$ are connected with the upper terminal of the power supply unit 30 and the emitters of each of the first phase upper power semiconductor device $Q_1$ and the second phase upper power semiconductor device $Q_3$ are connected with the lower terminal of the power supply unit 30 so as to connect only the first phase upper power semiconductor device $Q_1$ and the second phase upper power semiconductor device $Q_3$, respectively, with the power supply unit 30 in parallel.

According to the foregoing methods, in order to test the pair of power semiconductor devices connected with each other in series and having the same phase or the two power semiconductor devices connected with each other in parallel and having different phases simultaneously, the on/off operations of the corresponding relay switch devices are shown in Table 2.

TABLE 2

| Division | Phase | S1 | S2 | S3 | S4 | S5 | S6 | S7 | S8 | S9 |
|---|---|---|---|---|---|---|---|---|---|---|
| First Method (Same Phase) | UH-UL | off | off | on | off | off | off | off | off | off |
|  | VH-VL | off | off | off | off | off | on | off | off | off |
|  | WH-WL | off | off | off | off | off | off | off | off | on |
| Second Method (Different Phase) | UH-WH | off | on | off | off | off | off | off | on | off |
|  | UH-VL | off | on | off | off | off | off | off | off | off |
|  | UH-WL | off | on | off | off | off | off | on | off | off |
|  | UL-VH | on | off | on | off | on | off | off | off | off |
|  | UL-WH | on | off | on | off | off | off | off | on | off |
|  | UL-VL | on | off | on | off | off | on | off | off | off |
|  | UL-WL | on | off | on | off | off | off | on | off | on |
|  | VH-WH | off | off | off | off | on | off | off | on | off |
|  | VH-WL | off | off | off | off | on | off | on | off | on |
|  | VL-WH | off | off | off | on | off | on | off | on | off |
|  | VL-WL | off | off | off | on | off | on | on | off | on |

Simultaneously Test Three Power Semiconductor Devices

When testing three power semiconductor devices simultaneously, the control unit 60 may control the relay switching unit 20 as follows.

The three power semiconductor devices may be tested simultaneously by the following two methods, that is, a method (first method) of testing simultaneously testing the on/off operations of the three power semiconductor devices connected with one another in parallel and having different phases or a method (second method) of simultaneously testing the on/off operations of the three power semiconductor devices configured of the pair of power semiconductor devices connected with each other in series and having the same phase and one power semiconductor device connected with to the pair of power semiconductor devices in parallel and having different phases.

First, the first method simultaneously tests the three power semiconductor devices connected with one another in parallel and having different phases. For example, when testing the on/off operations of the first phase, second phase, and third phase upper power semiconductor devices $Q_1$, $Q_3$, and $Q_5$ simultaneously, the control unit 60 controls the relay switching unit 20 to supply the first switching control signal controlling to switch on only the first phase second relay switch device S2, the second phase second relay switch device S5, and the third phase second relay switch device S8 and to supply the second switching control signal controlling to switch off the remaining relay switch devices S1, S3 and S4, S6 and S7, and S9, such that the collectors of the first phase, second phase, and third phase upper power semiconductor devices $Q_1$, $Q_3$, and $Q_5$ are connected with the upper terminal of the power supply unit 30 and the emitters of the first phase, second phase, and third phase upper power semiconductor devices $Q_1$, $Q_3$, and $Q_5$ are connected with the upper terminal of the power supply unit 30 so as to connect the first phase, second phase, and third phase upper power semiconductor devices $Q_1$, $Q_3$, and $Q_5$ with the power supply 30 in parallel.

Similarly, when testing the on/off operations of the first phase, second phase, and third phase lower power semiconductor devices $Q_2$, $Q_4$, and $Q_8$ simultaneously, the control unit 60 controls the relay switching unit 20 controlling to switch on the first switching control signal to only the first phase first and third relay switch devices S1 and S3, the second phase first and third relay switch devices S4 and S6, and the third phase first and third relay switch devices S7 and S9 and to supply the second switching control signal controlling to switch off the remaining relay switch devices S2, S5 and S8, such that the collectors of the first phase, second phase, and third phase lower power semiconductor devices $Q_2$, $Q_4$, and $Q_8$ are connected with the upper terminal of the power supply unit 30 and the emitters of the first phase, second phase, and third phase lower power semiconductor devices $Q_2$, $Q_4$, and $Q_8$ are connected with the upper terminal of the power supply unit 30 so as to connect the first phase, second phase, and third phase lower power semiconductor devices $Q_2$, $Q_4$, and $Q_8$ with the power supply 30 in parallel.

Meanwhile, the second method simultaneously tests the on/off operations of the three power semiconductor devices configured of a pair of power semiconductor devices connected with one another in series and having the same phase and one power semiconductor device connected with the pair of power semiconductor devices in parallel and having different phases. For example, when testing the pair $Q_1$ and $Q_2$ of first phase upper and lower power semiconductor devices and the second phase upper power semiconductor device $Q_3$ simultaneously, the control unit 60 controls the relay switching unit 20 to supply the first switching control signal controlling to switch on only the first phase third relay switch device S3 and the second phase second relay switch device S5 and to supply the second switching control signal controlling to switch off the remaining relay switch devices S1 and S2, S4, and S6 to S9, such that the collector of the first phase upper power semiconductor device $Q_1$ is connected with the upper terminal of the power supply unit 30 and the emitter of the first phase lower power semiconductor device $Q_2$ is connected with the lower terminal of the power supply unit 30 so as to connect the pair $Q_1$ and $Q_2$ of the first phase upper and lower power semiconductor devices connected with each other in series with the power supply 30 in parallel and the collector of the second phase upper power semiconductor device $Q_3$ is connected with the upper terminal of the power supply unit 30 and the emitter thereof is connected with the lower terminal of the power supply to unit 30 so as to connect the second phase upper power semiconductor device $Q_3$ with the power supply unit 30 in parallel.

By the foregoing methods, the on/off operations of the corresponding relay switch devices for testing the on/off operations of the three power semiconductor devices simultaneously are shown in Table 3.

TABLE 3

| Division | Phase | S1 | S2 | S3 | S4 | S5 | S6 | S7 | S8 | S9 |
|---|---|---|---|---|---|---|---|---|---|---|
| First Method | UH-VH-WH | off/on | on | off/on | off/on | on | off | off | on | off |
| | UL-VL-WL | on | off | on | on | off | on | on | off | on |
| Second Method | UH-UL-VH | off | off | on | off | on | off | off | off | off |
| | UH-UL-VL | off | off | on | on | off | on | off | off | off |
| | UH-UL-WH | off | off | on | off | off | off | off | on | off |
| | UH-UL-WL | off | off | on | off | off | off | on | off | on |
| | VH-VL-UH | off | on | off | off | off | on | off | off | off |
| | VH-VL-UL | on | off | on | off | off | on | off | off | off |
| | VH-VL-WH | off | on | off | off | off | on | off | off | off |
| | VH-VL-WL | off | off | off | off | off | on | on | off | on |
| | WH-WL-UH | off | on | off | off | off | off | off | off | on |
| | WH-WL-UL | on | off | on | off | off | off | off | off | on |
| | WH-WL-VH | off | off | off | off | on | off | off | off | on |
| | WH-WL-VL | off | off | off | on | off | on | off | off | on |

TABLE 4

| Division | Phase | S1 | S2 | S3 | S4 | S5 | S6 | S7 | S8 | S9 |
|---|---|---|---|---|---|---|---|---|---|---|
| $Q_1$-$Q_2$-$Q_3$-$Q_4$-$Q_5$-$Q_6$ | UH-UL-VH-VL-WH-WL | off | off | on | off | off | on | off | off | on |

Simultaneously Test Six Power Semiconductor Devices

When testing six power semiconductor devices simultaneously, the control unit 60 may control the relay switching unit 20 as follows.

When testing the six power semiconductor devices simultaneously, the control unit 60 may simultaneously test the on/off operations of the three pairs $Q_1$-$Q_2$, $Q_3$-$Q_4$, and $Q_5$-$Q_6$ of power semiconductor devices by simultaneously connecting the three pairs $Q_1$-$Q_2$, $Q_3$-$Q_4$, and $Q_5$-$Q_6$ of power semiconductor devices configured of the pairs of upper and lower power semiconductor devices connected with each other in series and having the same phase with the power supply unit 30 in parallel.

That is, when testing the on/off operations of the three pairs $Q_1$-$Q_2$, $Q_3$-$Q_4$, and $Q_5$-$Q_6$ of power semiconductor devices simultaneously, the control unit 60 controls the relay switching unit 20 to supply a first switching control signal controlling to switch on the first switching control signal only to the first phase third relay switch device S3, the second phase third relay switch device S6, and the third phase third relay switch device S9 and to supply the second switching control signal controlling to switch off the remaining relay switch devices S1, S3 and S4, S6 and S7, and S9, such that the collectors of the first phase, second phase, and third phase upper power semiconductor devices $Q_1$, $Q_3$, and $Q_5$ are connected with the upper terminal of the power supply unit 30 and the emitters of the first phase, second phase, and third phase lower power semiconductor devices $Q_1$, $Q_3$, and $Q_5$ are connected with the lower terminal of the power supply unit 30 so as to connect all the three pairs $Q_1$-$Q_2$, $Q_3$-$Q_4$, and $Q_5$-$Q_6$ of power semiconductor devices with the power supply unit in parallel.

By the foregoing methods, the on/off operations of the corresponding relay switch devices for testing the on/off operations of the six power semiconductor devices simultaneously are shown in Table 6.

FIGS. 2A to 2C are graphs illustrating measurement results according to a switching test of a single power semiconductor device from the apparatus for testing switching of a power semiconductor module illustrated in FIG. 1, FIGS. 3A to 3C are graphs illustrating measurement results according to a simultaneous switching test of two power semiconductor devices from the apparatus for testing switching of a power semiconductor module illustrated in FIG. 1, FIGS. 4A to 4C are graphs illustrating measurement results according to a simultaneous switching test of three power semiconductor devices from the apparatus for testing switching of a power semiconductor module illustrated in FIG. 1, and FIGS. 5A to 5C are graphs illustrating measurement results according to a simultaneous switching test of six power semiconductor devices from the apparatus for testing switching of a power semiconductor module illustrated in FIG. 1.

In detail, FIG. 2A is a graph illustrating a change in temperature of the corresponding power semiconductor device over time at the time of an on/off test of a single power semiconductor device and FIGS. 2B and 2C are graphs illustrating a change in current Ice and voltage Vce between collector-emitter of the corresponding power semiconductor device over time at the time of an on/off test of a single power semiconductor device.

FIG. 3A is a graph illustrating a change in temperature of the corresponding power semiconductor device over time at the time of an on/off simultaneous test of two power semiconductor devices and FIGS. 3B and 3C are graphs illustrating a change in current Ice and voltage Vce between collector-emitter of the corresponding power semiconductor device according to the on/off of the two power semiconductor devices.

FIG. 4A is a graph illustrating a change in temperature of the corresponding power semiconductor devices over time at the time of an on/off simultaneous test of three power semiconductor devices and FIGS. 4B and 4C are graphs illustrating a change in current Ice and voltage Vce between collector-emitter of the corresponding power semiconductor device according to the on/off of the three power semiconductor devices.

FIG. 5A is a graph illustrating a change in temperature of the corresponding power semiconductor devices over time at the time of an on/off simultaneous test of six power semiconductor devices and FIGS. 5B and 5C are graphs illustrating a change in current Ice and voltage Vce between collector-emitter of the corresponding power semiconductor device according to the on/off of the six power semiconductor devices.

First, as illustrated in FIG. 2A, when the corresponding power semiconductor device is turned on, the temperature is increased slowly and when the corresponding power semiconductor device is turned off, the temperature is reduced slowly.

Further, as illustrated in FIGS. 2B and 2C, it can be appreciated that when the corresponding power semiconductor device is turned on, the current Ice between collector-emitter of the corresponding power semiconductor device is about 5 A and the voltage Vce between collector-emitters is about 1.5V and when the corresponding power semiconductor device is turned off, all the current Ice and the voltage Vce between collector-emitter of the corresponding power semiconductor device may be zero (0). It can be appreciated from this that the corresponding power semiconductor device is appropriately operated as a switch.

Similarly, even when testing two, three, and six power semiconductor devices simultaneously, it can be appreciated from FIG. 3A to FIG. 5C that the corresponding power semiconductor device is appropriately operated as a switch.

As described above, the apparatus for testing switching of a power semiconductor module according to the preferred embodiment of the present invention can test the on/off operations of the plurality of power semiconductor devices individually or simultaneously, by the control of the plurality of relay switch devices, thereby improving the user convenience and reducing the test time.

According to the preferred embodiment of the present invention, it is possible to improve the user convenience and reduce the test time by individually and simultaneously testing the on/off operations of the plurality of power semiconductor devices, by the plurality of relay switch devices.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. An apparatus for testing switching of a power semiconductor module, comprising:
   a power semiconductor module including a plurality of power semiconductor devices corresponding to a plurality of phases to test a switching operation of a corresponding power semiconductor device;
   a power supply unit supplying power to the power semiconductor module;
   a relay switching unit including a plurality of relay switch devices that connects or disconnects between the power semiconductor module and the power supply unit according to a relay control signal; and
   a control unit controlling the relay switching unit to test on/off characteristics of the plurality of power semiconductor devices simultaneously,
   wherein the control unit controls the on/off of the relay switching unit connecting between the power semiconductor module and the power supply unit through various paths to supply power to the corresponding power semiconductor devices so as to test the on/off operation of the corresponding power semiconductor device.

2. The apparatus as set forth in claim 1, wherein the power semiconductor module includes:
   a plurality of power semiconductor circuits corresponding to each phase and connected with the power supply unit in parallel, respectively, so as to supply or block power according to the relay control signal; and
   a gate driving power supply controlling a gate signal input according to a gate control signal so as to perform on/off operations of the plurality of power semiconductor circuits.

3. The apparatus as set forth in claim 2, wherein the plurality of power semiconductor circuits include:
   a first power semiconductor circuit including a first phase upper power semiconductor device corresponding to a first phase and having a collector connected with an upper terminal of the power supply unit and an emitter connected with a lower terminal of the power supply unit and a first phase lower power semiconductor device having a collector connected with the emitter of the first phase upper power semiconductor device and an emitter connected with the lower terminal of the power supply unit;
   a second power semiconductor circuit including a second phase upper power semiconductor device corresponding to a second phase and having a collector connected with an upper terminal of the power supply unit and an emitter connected with a lower terminal of the power supply unit and a second phase lower power semiconductor device having a collector connected with the emitter of the second phase upper power semiconductor device and an emitter connected with the lower terminal of the power supply unit; and
   a third power semiconductor circuit including a third phase upper power semiconductor device corresponding to a third phase and having a collector connected with an upper terminal of the power supply unit and an emitter connected with a lower terminal of the power supply unit and a third phase lower power semiconductor device having a collector connected with the emitter of the third phase upper power semiconductor device and an emitter connected with the lower terminal of the power supply unit.

4. The apparatus as set forth in claim 3, wherein the first power semiconductor circuit further includes:
   a first phase upper diode having an anode connected with the emitter of the first phase upper power semiconductor device and a cathode connected with the collector of the first phase upper power semiconductor device and feedbacking collector-emitter current of the first phase upper power semiconductor device when the first phase upper power semiconductor device is turned off; and
   a first phase lower diode having an anode connected with the emitter of the first phase lower power semiconductor device and a cathode connected with the collector of the first phase lower power semiconductor device and feedbacking collector-emitter current of the first phase lower power semiconductor device when the first phase lower power semiconductor device is turned off.

5. The apparatus as set forth in claim 3, wherein the second power semiconductor circuit further includes:

a second phase upper diode having an anode connected with the emitter of the second phase upper power semiconductor device and a cathode connected with the collector of the second phase upper power semiconductor device and feed-backing collector-emitter current of the second phase upper power semiconductor device when the second phase upper power semiconductor device is turned off; and a second phase lower diode having an anode connected with the emitter of the second phase lower power semiconductor device and a cathode connected with the collector of the second phase lower power semiconductor device and feed-backing collector-emitter current of the second phase lower power semiconductor device when the second phase lower power semiconductor device is turned off.

6. The apparatus as set forth in claim 3, wherein the third power semiconductor circuit further includes:

a third phase upper diode having an anode connected with the emitter of the third phase upper power semiconductor device and a cathode connected with the collector of the third phase upper power semiconductor device and feed-backing collector-emitter current of the third phase upper power semiconductor device when the third phase upper power semiconductor device is turned off; and a third phase lower diode having an anode connected with the emitter of the third phase lower power semiconductor device and a cathode connected with the collector of the third phase lower power semiconductor device and feed-backing collector-emitter current of the third phase lower power semiconductor device when the third phase lower power semiconductor device is turned off.

7. The apparatus as set forth in claim 3, wherein the relay switching unit includes:

a first phase relay switch circuit connecting or disconnecting the first power semiconductor circuit with or from the power supply unit so as to supply power to the first power semiconductor circuit;

a second phase relay switch circuit connecting or disconnecting the second power semiconductor circuit with or from the power supply unit so as to supply power to the second power semiconductor circuit; and a third phase relay switch circuit connecting or disconnecting the third power semiconductor circuit with or from the power supply unit so as to supply power to the third power semiconductor circuit.

8. The apparatus as set forth in claim 7, wherein the first phase relay switch circuit includes:

a first phase first relay switch device connected between the emitter and the collector of the first phase upper power semiconductor device in parallel;

a first phase second relay switch device connected between the emitter of the first phase upper power semiconductor device and the lower terminal of the power supply unit in series; and a first phase third relay switch device connected between the emitter of the first phase lower power semiconductor device and the lower terminal of the power supply unit in series.

9. The apparatus as set forth in claim 8, wherein the second phase relay switch circuit includes:

a second phase first relay switch device connected between the emitter and the collector of the second phase upper power semiconductor device in parallel;

a second phase second relay switch device connected between the emitter of the second phase upper power semiconductor device and the lower terminal of the power supply unit in series; and a second phase third relay switch device connected between the emitter of the second phase lower power semiconductor device and the lower terminal of the power supply unit in series.

10. The apparatus as set forth in claim 9, wherein the third phase relay switch circuit includes:

a third phase first relay switch device connected between the emitter and the collector of the third phase upper power semiconductor device in parallel;

a third phase second relay switch device connected between the emitter of the third phase upper power semiconductor device and the lower terminal of the power supply unit in series; and a third phase third relay switch device connected between the emitter of the third phase lower power semiconductor device and the lower terminal of the power supply unit in series.

11. The apparatus as set forth in claim 10, wherein the control unit controls the relay switching unit to supply a first switching control signal controlling to switch on only the second relay switch device of the corresponding phase, respectively, and to supply a second switching control signal controlling to switch off the first and third relay switch devices of the corresponding phase, when testing each of the on/off characteristics of the upper power semiconductor device of each phase among the plurality of upper and lower power semiconductor devices.

12. The apparatus as set forth in claim 10, wherein the control unit controls the relay switching unit to supply a first switching control signal controlling to switch on only the first and second relay switch device of the corresponding phase, respectively, and to supply a second switching control signal controlling to switch off the second switch device of the corresponding phase, when testing each of the on/off characteristics of the lower power semiconductor device of each phase among the plurality of upper and lower power semiconductor devices.

13. The apparatus as set forth in claim 10, wherein the control unit controls the relay switching unit to supply a first switching control signal controlling to switch on only the third relay switch device of the corresponding phase and to supply a second switching control signal controlling to switch off the first and second relay switch devices of the corresponding phase, when simultaneously testing the upper and lower power semiconductor devices of the same phase among the plurality of upper and lower power semiconductor devices.

14. The apparatus as set forth in claim 10, wherein the control unit controls the relay switching unit to supply a first switching control signal controlling to switch on only the second relay switch device of the corresponding phase simultaneously and to supply a second switching control signal controlling to switch off the first and third relay switch devices of the corresponding phase, when simultaneously testing the two upper power semiconductor devices of different phases among the plurality of upper and lower power semiconductor devices.

15. The apparatus as set forth in claim 10, wherein the control unit controls the relay switching unit to supply a first switching control signal controlling to switch on only the first and third relay switch device of the corresponding phase simultaneously and to supply a second switching control signal controlling to switch off the second relay switch device of the corresponding phase, when simultaneously testing the two lower power semiconductor devices of different phases among the plurality of upper and lower power semiconductor devices.

16. The apparatus as set forth in claim 10, wherein the control unit controls the relay switching unit to supply a first switching control signal controlling to switch on only the second relay switch device of a phase corresponding to the corresponding upper power semiconductor device and the first and third relay switch device of a phase corresponding to the corresponding lower power semiconductor device and to supply a second switching control signal controlling to switch off the first and third relay switch device of a phase corresponding to the corresponding upper power semiconductor device and the second relay switch device of a phase corresponding to the corresponding lower power semiconductor device, when simultaneously testing the upper power semiconductor device of any one phase and the lower power semiconductor device of a phase different from the upper power semiconductor device among the plurality of upper and lower power semiconductor devices.

17. The apparatus as set forth in claim 10, wherein the control unit controls the relay switching unit to supply a first switching control signal only controlling to switch on only the second relay device of each phase simultaneously and to supply a second switching control signal controlling to switch off the first and third relay switch devices of each phase, when simultaneously testing the three upper power semiconductor devices of each phase among the plurality of upper and lower power semiconductor devices.

18. The apparatus as set forth in claim 10, wherein the control unit controls the relay switching unit to supply a first switching control signal controlling to switch on only to the first and third relay switch device of each phase simultaneously and to supply a second switching control signal controlling to switch off the second relay switch device of each phase, when simultaneously testing the three lower power semiconductor devices of each phase among the plurality of upper and lower power semiconductor devices.

19. The apparatus as set forth in claim 10, wherein the control unit controls the relay switching unit to supply a first switching control signal controlling to switch on only to the third relay switch device of each phase simultaneously and to supply a second switching control signal controlling to switch off the first and second relay switch devices of each phase, when simultaneously testing six of the plurality of upper and lower power semiconductor devices.

* * * * *